United States Patent
Herrault (10) Patent No.: US 11,527,482 B2
(45) Date of Patent: Dec. 13, 2022

(54) HYBRID INTEGRATED CIRCUIT ARCHITECTURE

(71) Applicant: HRL Laboratories, LLC, Malibu, CA (US)

(72) Inventor: Florian G. Herrault, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 89 days.

(21) Appl. No.: 17/214,374

(22) Filed: Mar. 26, 2021

(65) Prior Publication Data

US 2021/0233857 A1 Jul. 29, 2021

Related U.S. Application Data (63) Continuation-in-part of application No. 16/158,212, filed on Oct. 11, 2018, now Pat. No. 10,998,273.

(Continued)

(51) Int. Cl.
*H01L 23/538* (2006.01)
*H01L 23/482* (2006.01)
(Continued)

(52) U.S. Cl.
CPC .......... *H01L 23/5386* (2013.01); *H01L 24/40* (2013.01); *H01L 24/48* (2013.01);
(Continued)

(58) Field of Classification Search
CPC ..... H01L 25/0655; H01L 25/50; H01L 25/18; H01L 25/165; H01L 23/5386;
(Continued)

(56) References Cited

U.S. PATENT DOCUMENTS 8,017,451 B2 9/2011 Racz
8,617,927 B1 12/2013 Margomenos
(Continued)

FOREIGN PATENT DOCUMENTS

FR 2 917 234 12/2008
JP 2012-004314 A 1/2012
(Continued)

OTHER PUBLICATIONS

PCT International Search Report and Written Opinion from PCT/US2019/050384 dated Jan. 20, 2020.

(Continued)

*Primary Examiner* — Omar F Mojaddedi
(74) *Attorney, Agent, or Firm* — Ladas & Parry, LLP (57) ABSTRACT

An electronic assembly comprising a carrier wafer having a top wafer surface and a bottom wafer surface; an electronic integrated circuit being formed in the carrier wafer and comprising an integrated circuit contact pad on the top wafer surface; said carrier wafer comprising a through-wafer cavity having walls that join said top wafer surface to said bottom wafer surface; a component chip having a component chip top surface, a component chip bottom surface and component chip side surfaces, the component chip being held in said through-wafer cavity by direct contact of at least a side surface of said component chip with an attachment metal that fills at least a portion of said through-wafer cavity; said component chip comprising at least one component contact pad on said component chip bottom surface; and a conductor connecting said integrated circuit contact pad and said component contact pad.

20 Claims, 4 Drawing Sheets

Related U.S. Application Data (60) Provisional application No. 62/610,099, filed on Dec. 22, 2017.

(51) Int. Cl.
| | |
|---|---|
| *H01L 23/367* | (2006.01) |
| *H01L 25/065* | (2006.01) |
| *H01L 25/16* | (2006.01) |
| *H01L 21/683* | (2006.01) |
| *H01L 21/56* | (2006.01) |
| *H01L 23/00* | (2006.01) |
| *H01L 25/00* | (2006.01) |

(52) U.S. Cl.
CPC .......... *H01L 25/0655* (2013.01); *H01L 25/50* (2013.01); *H01L 2224/40157* (2013.01); *H01L 2224/48157* (2013.01)

(58) Field of Classification Search
CPC ............. H01L 23/5389; H01L 23/4827; H01L 23/367; H01L 23/13; H01L 23/14; H01L 23/31
See application file for complete search history.

(56) References Cited

U.S. PATENT DOCUMENTS

| | | |
|---|---|---|
| 9,214,404 B1 | 12/2015 | Margomenos |
| 9,337,124 B1 | 5/2016 | Herrault |
| 9,385,083 B1 | 7/2016 | Herrault |
| 9,508,652 B1 | 11/2016 | Herrault |
| 9,837,372 B1 | 12/2017 | Herrault |
| 10,957,537 B2 | 3/2021 | Herrault |
| 10,998,273 B2 | 5/2021 | Herrault |
| 2001/0010398 A1 | 8/2001 | Farooq |
| 2002/0110952 A1 | 8/2002 | Gris |
| 2006/0105496 A1* | 5/2006 | Chen ................... H01L 25/0652 257/E21.597 |
| 2006/0131736 A1* | 6/2006 | Jansman ............. H01L 23/5389 257/E23.101 |
| 2007/0025092 A1* | 2/2007 | Lee ..................... H01L 23/5389 361/764 |
| 2008/0224320 A1* | 9/2008 | Palmade ................. H01L 24/82 257/E23.079 |
| 2009/0251362 A1 | 10/2009 | Margomenos |
| 2011/0140216 A1 | 6/2011 | Qu |
| 2011/0266569 A1 | 11/2011 | Basin |
| 2012/0037935 A1* | 2/2012 | Yang .................... H01L 33/641 257/E33.056 |
| 2012/0319295 A1 | 12/2012 | Heejo |
| 2013/0168803 A1 | 7/2013 | Haddad |
| 2014/0021610 A1* | 1/2014 | Von Koblinski .... H01L 23/5389 257/734 |
| 2014/0203239 A1 | 7/2014 | Schubert |
| 2014/0264808 A1 | 9/2014 | Wolter |
| 2016/0111616 A1 | 4/2016 | Margalit |
| 2016/0293557 A1 | 10/2016 | Topak |
| 2016/0308270 A1 | 10/2016 | Ding |
| 2016/0329232 A1 | 11/2016 | Golda |
| 2017/0155450 A1 | 6/2017 | Dosunmu |
| 2017/0363589 A1 | 12/2017 | Kumar |
| 2018/0019178 A1 | 1/2018 | Lin |
| 2018/0148328 A1 | 5/2018 | Agache |
| 2019/0198449 A1 | 6/2019 | Herrault |
| 2021/0208240 A1 | 7/2021 | Herrault |

FOREIGN PATENT DOCUMENTS

| | | |
|---|---|---|
| KR | 10-2013-0117329 | 10/2013 |
| KR | 10-2020-0002229 A | 1/2020 |

OTHER PUBLICATIONS

PCT International Search Report and Written Opinion from PCT/US2018/055516 dated Feb. 1, 2019.

PCT International Preliminary Report on Patentability (Chapter I) with Written Opinion from PCT/US2018/055516 dated Jun. 23, 2020.

Chinoy, P. et al., "Manufacture of low-loss microwave circuits using HMIC technology," 1994 IEEE MTT-S International Microwave Symposium Digest (Cat. No. 94CH3389-4), San Diego, CA, USA, 1994, pp. 1137-1140 vol. 2, doi: 10.1109/MWSYM.1994.335544.

PCT International Preliminary Report on Patentability (Chapter I) with Written Opinion from PCT/US2019/050384 dated May 11, 2021.

PCT International Search Report and Written Opinion from PCT/US2021/023510 dated Jul. 15, 2021.

From U.S. Appl. No. 16/158,212 (now U.S. Pat. No. 10,998,273), Notice of Allowance dated Jan. 8, 2021.

From U.S. Appl. No. 16/158,212 (now U.S. Pat. No. 10,998,273), Office Action dated Dec. 4, 2020.

From U.S. Appl. No. 16/158,212 (now U.S. Pat. No. 10,998,273), Office Action dated Jul. 29, 2020.

From U.S. Appl. No. 16/158,212 (now U.S. Pat. No. 10,998,273), Office Action dated Jan. 16, 2020.

Extended European Search Report from European Patent Application No. 18893286.7 dated Oct. 14, 2021.

PCT International Search Report and Written Opinion from PCT/US2021/024519 dated Dec. 21, 2021.

* cited by examiner

HYBRID INTEGRATED CIRCUIT ARCHITECTURE

RELATED APPLICATIONS

This application claims priority of US provisional application No. U.S. 62/610,099; which is hereby incorporated by reference. This application is a continuation in part of US non-provisional application No. U.S. Ser. No. 16/158,212 which is hereby incorporated by reference.

STATEMENT REGARDING FEDERALLY SPONSORED RESEARCH OR DEVELOPMENT

This invention was made with Government support under contract number HR0011-19-C-0006, awarded by the DARPA. The Government has certain rights in the invention.

TECHNICAL FIELD

This presentation relates to electronic assemblies; in particular electronic assemblies comprising one or more microelectronic components integrated into a microelectronic wafer fabricated separately.

BACKGROUND

Electronic assemblies, or hybrid circuits, comprise microelectronic circuits fabricated separately and assembled together so as to form a single component, which can itself be encapsulated in an electronic circuit package. Assembling microelectronic circuits fabricated separately allows one to, for example, test all the microelectronic circuits separately, prior to assembling them, which, in turn enables improved fabrication yields of the final component. This capability is particularly significant if some of the microelectronic circuits fabricated separately are difficult and/or expensive to manufacture, Assembling microelectronic circuits fabricated separately also allows one to combine microelectronic circuits, which themselves employ different materials and different manufacturing processes, into a single final component. This capability can lead to higher circuit performance.

The reference "P. Chinoy, N. Jain, Ping Li, J. Goodrich and C. Souchuns, "Manufacture of low-loss microwave circuits using HMIC technology," 1994 *IEEE MTT-S International Microwave Symposium Digest* (Cat. No. 94CH3389-4) San Diego, Calif., USA, 1994, pp. 1137-1140 vol-2, doi: 10.1109/MWSYM.1994.335544" discloses a low-cost, batch-processed, surface-mountable, microwave manufacturing technology that provides hybrid-type flexibility with monolithic-type passive components with repeatability and precision. The reference discloses, in particular, power amplifier circuits with high power-added efficiencies and reduced size paving the way for low-cost, high-performance circuits for wireless communication markets.

U.S. Pat. Nos. 8,617,927 and 9,214,404, which are hereby incorporated by reference in their entirety, disclose a method and apparatus for mounting microelectronic chips to a thermal heat sink. The chips are arranged in a desired configuration with their active faces all facing a common direction and with their active faces defining a common planar surface for all of said chips. A metallic material is applied to the chip, preferably by electroplating to backsides of the chips, the metallic material being electro-formed thereon and making void-free contact with the backsides of the chips.

U.S. Pat. No. 9,508,652, which is hereby incorporated by reference in its entirety, discloses a method for wafer level packaging that includes forming one or more die, forming a plated metal ring (PMR) on each die, forming a cover wafer (CW), the CW having one or more plated seal rings, forming a body wafer (BW), the BW having cavities and a metal layer on a first side of the BW, aligning a respective die to the CW so that a PMR on the respective die is aligned to a respective plated seal ring (PSR) on the CW, bonding the PMR on the respective die to the respective PSR, aligning the BW to the CW so that a respective cavity of the BW surrounds each respective die bonded to the CW and so that the metal layer on the BW is aligned with at least one PSR on the CW, and bonding the metal layer on the first side of the BW to the PSR on the CW. Each PMR has a first height and each PSR has a second height.

U.S. Pat. Nos. 9,837,372 and 9,385,083, which are hereby incorporated by reference in their entirety, disclose an interconnect and manufacturing method for electrically coupling pads formed on adjacent chips (or on packaging material adjacent the chips) with an electrically conductive heat sink being disposed between the pads, the interconnect comprising a metallic membrane layer disposed between two adjacent pads and disposed or bridging over the electrically conductive heat sink so as to avoid making electrical contact with the electrically conductive heat sink. An electroplated metallic layer is disposed on the metallic membrane layer. Multiple interconnects can be formed in parallel using manufacturing techniques compatible with wafer level fabrication of the interconnects. The interconnects preferably follow a smooth curve to electrically connect adjacent pads and following that smooth curve they bridge over the intervening electrically conductive heat sink material in a predictable fashion.

U.S. Pat. No. 9,337,124, which is hereby incorporated by reference in its entirety, discloses a method for forming a wafer level heat spreader that includes providing a mesh wafer, the mesh wafer having a plurality of openings and mesh regions between the openings, bonding the mesh wafer to a backside of an integrated circuit (IC) wafer, the IC wafer comprising a plurality of circuits; and electroplating a heat sink material through the plurality of openings and onto to the backside of the IC wafer.

There remains a need for an electronic assembly or hybrid component that is easier and more economical to manufacture with high manufacturing yields than those presently known.

SUMMARY

Embodiments of the presentation comprise an electronic assembly or hybrid circuit where a microelectronic circuit in a wafer is connected to a microelectronic circuit in a chip; the chip being embedded in a metal-filled cavity of the wafer, wherein the microelectronic circuit in the wafer and the microelectronic circuit in the chip have contact pads on opposite surfaces of the assembly, and wherein a conductor connects said contact pads.

As for example shown in the FIGS. 1 to 6, an embodiment of this presentation comprises an electronic assembly (for example 10), with: a carrier wafer (for example 12) having a top wafer surface (for example 14) and a bottom wafer surface (for example 16); an electronic integrated circuit being formed in the carrier wafer (for example 12) and comprising a first integrated circuit contact pad (for example 18) on the top wafer surface (for example 14); said carrier wafer (for example 12) comprising a through-wafer cavity (for example 20) having walls (for example 22) that join said top wafer surface (for example 14) to said bottom wafer surface (for example 16); a first component chip (for example 24) having a first component chip top surface (for example 26), a first component chip bottom surface (for example 28) and first component chip side surfaces (for example 30), the first component chip (for example 24) being held in said through-wafer cavity (for example 20) by direct contact of at least a side surface (for example 30) of said first component chip (for example 24) with an attachment metal (for example 32) that fills at least a portion of said through-wafer cavity (for example 20); said first component chip (for example 24) comprising at least one first component contact pad (for example 34) on said first component chip bottom surface (for example 28); and a first conductor (for example 36, 38; 37, 32) connecting said first integrated circuit contact pad (for example 18) and said first component contact pad (for example 34).

According to an embodiment of this presentation, said carrier wafer (for example 12) and said first component chip (for example 24) have a same thickness, and wherein said first conductor (for example 36, 38; 37, 32) comprises a via (for example 38) traversing said first component chip (for example 24).

According to an embodiment of this presentation, said first conductor (for example 36, 38; 37, 32) comprises a metal strip or wire (for example 36) connecting said first integrated circuit contact pad (for example 18) to a top portion of said via (for example 38) traversing said first component chip (for example 24).

According to an embodiment of this presentation, said carrier wafer (for example 12) and said first component chip (for example 24) have a same thickness, wherein said attachment metal (for example 32) fills said at least a portion of said through-wafer cavity (for example 20) along the full height of said through-wafer cavity (for example 20); and wherein said first conductor (for example 36, 38; 37, 32) comprises said attachment metal (for example 32).

According to an embodiment of this presentation, said first conductor (for example 36, 38; 37, 32) comprises a metal strip or wire (for example 37) connecting said first integrated circuit contact pad (for example 18) to a top portion of said attachment metal (for example 32).

According to an embodiment of this presentation, said attachment metal (for example 32) covers at least a portion of said first component chip bottom surface (for example 28) and said first component contact pad (for example 34).

Figure 4:
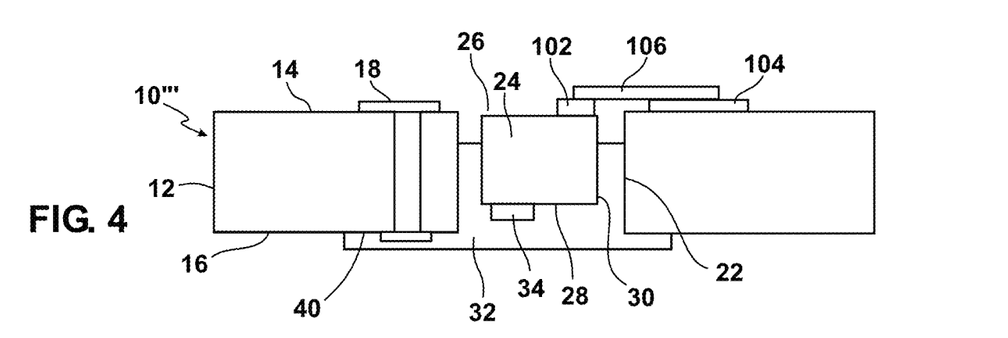
FIG. 4 is a cross-section of an electronic assembly according to an embodiment of this presentation.
Figure 6:
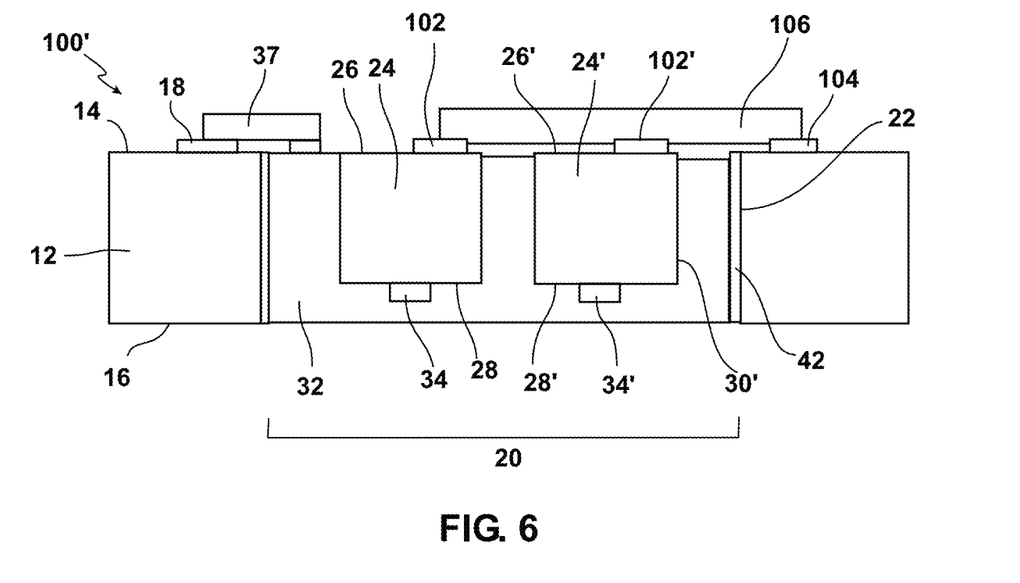
FIG. 6 is a cross-section of an electronic assembly according to an embodiment of this presentation.

As shown for example in FIGS. 4 and 6, according to an embodiment of this presentation, wherein said carrier wafer (for example 12) is thicker than said first component chip (for example 24), wherein the attachment metal (for example 32) holds the first component chip (for example 24) such that the first component chip top surface (for example 26) is flush with the top wafer surface (for example 14), and wherein said first conductor (for example 36, 38; 37, 32) comprises said attachment metal (for example 32).

As shown for example in FIG. 6, according to an embodiment of this presentation, said attachment metal (for example 32) fills said at least a portion of said through-wafer cavity (for example 20) along the full height of said through-wafer cavity (for example 20); wherein said first conductor (for example 36, 38; 37, 32) comprises a metal strip or wire (for example 37) connecting said first integrated circuit contact pad (for example 18) to a top portion of said attachment metal (for example 32).

As shown for example in FIG. 6, according to an embodiment of this presentation, said attachment metal (for example 32) covers at least a portion of said first component chip bottom surface (for example 28) and said first component contact pad (for example 34).

As shown for example in FIG. 4, according to an embodiment of this presentation, said first conductor (for example 36, 38; 37, 32) comprises said attachment metal (for example 32) as well as a via (for example 40) traversing said first carrier wafer (for example 12).

As shown for example in FIG. 4, according to an embodiment of this presentation, said attachment metal (for example 32) covers at least a portion of said first component chip bottom surface (for example 28), a bottom portion of said via (for example 40) traversing said first carrier wafer (for example 12).

Figure 3:
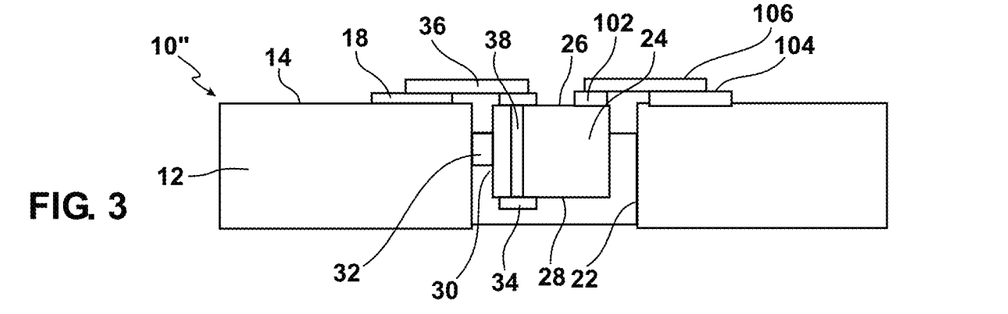
FIG. 3 is a cross-section of an electronic assembly according to an embodiment of this presentation.

As shown for example in FIG. 3, according to an embodiment of this presentation, said carrier wafer (for example 12) is thicker than said first component chip (for example 24), wherein the attachment metal (for example 32) holds the first component chip (for example 24) such that the first component chip top surface (for example 26) is flush with the top wafer surface (for example 14), and wherein said first conductor (for example 36, 38; 37, 32) comprises a via (for example 38) traversing said first component chip (for example 24).

As shown for example in FIG. 3, according to an embodiment of this presentation, said first conductor (for example 36, 38; 37, 32) comprises a metal strip or wire (for example 36) connecting said first integrated circuit contact pad (for example 18) to a top portion of said via (for example 38) traversing said first component chip (for example 24).

As shown for example in FIG. 6, according to an embodiment of this presentation, the walls (for example 22) of the through-wafer cavity (for example 20) are covered with a dielectric layer (42).

According to an embodiment of this presentation, the carrier wafer (for example 12) and the first component chip (for example 24) are made of different materials.

According to an embodiment of this presentation, the first component chip (for example 24) is an integrated circuit chip comprising one or more transistors.

Figure 5:
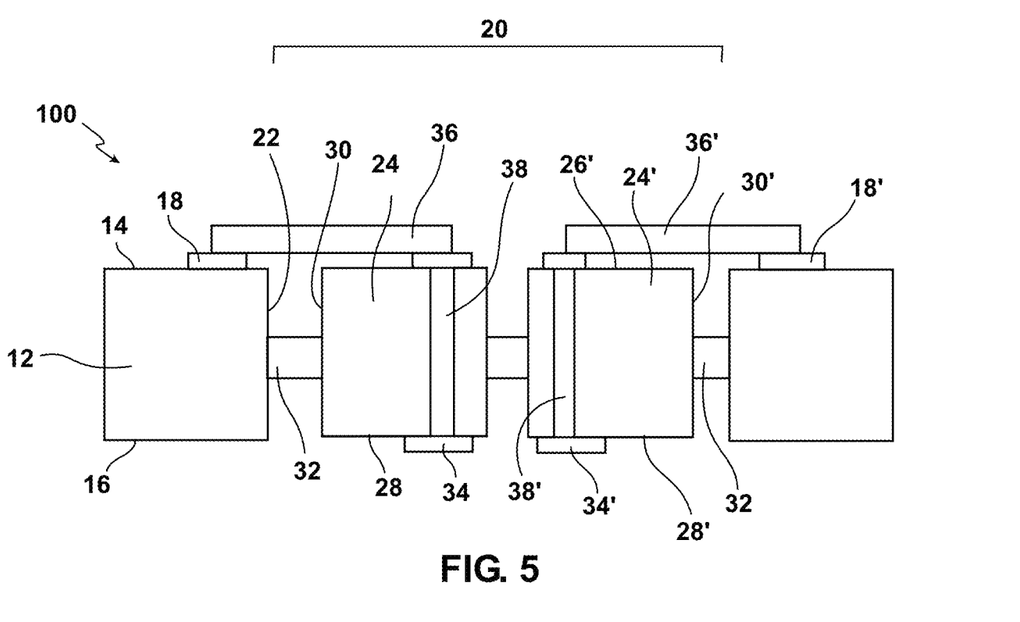
FIG. 5 is a cross-section of an electronic assembly according to an embodiment of this presentation.

As shown for example in FIGS. 5 and 6, according to an embodiment of this presentation, the electronic assembly comprises a second component chip (for example 24') also held in said through-cavity (for example 20) by direct contact of at least a side surface (for example 30') of said second component chip (for example 24') with said attachment metal (for example 32); said second component chip (for example 24') comprising at least one second component contact pad (for example 34') on one of a top surface (for example 26') and a bottom surface (for example 28') of the second component chip (for example 24'); the electronic integrated circuit formed in the carrier wafer comprising a second integrated circuit contact pad (for example 18'; 18) on one of the top wafer surface (for example 14) and the bottom wafer surface (for example 16); wherein a second conductor (for example 36', 38'; 32, 37) connects the second integrated circuit contact pad (for example 34') and the second component contact pad (for example 18', 18).

As shown for example in FIG. 5, according to an embodiment of this presentation, at least one of the first component chip (for example 24) and the second component chip (for example 24') is thinner than the wafer, and the attachment metal (for example 32) holds the first and second component chips (for example 24, 24') such that the first and second component chip top surfaces (for example 26, 26') are flush with the top wafer surface.

Other embodiments of this presentation relate to a method of manufacturing an electronic assembly, the method comprising: providing a first component chip (for example 24) having a first component chip top surface (for example 26), a first component chip bottom surface (for example 28) and first component chip side surfaces (for example 30); said first component chip (for example 24) comprising at least one first component contact pad (for example 34) on said first component chip bottom surface (for example 28) and a via (for example 38) providing an electrical path between the first component chip top surface (for example 26) and the first component contact pad (for example 34); providing a handle wafer (for example 44) having a first surface (for example 46); attaching (for example 50) said first component chip top surface (for example 26) to said first surface (for example 46) of said handle wafer (for example 44); providing a carrier wafer (for example 12) having a top wafer surface (for example 14) and a bottom wafer surface (for example 16); forming in the carrier wafer (for example 12) an electronic integrated circuit (for example 48) having a first integrated circuit contact pad (for example 18) on the top wafer surface (for example 14); forming in the carrier wafer a through-wafer cavity (for example 20) having walls (for example 22) that join said top wafer surface (for example 14) to said bottom wafer surface (for example 16); attaching said top wafer surface (for example 14) to said first surface of said handle wafer (for example 44) such that said first component chip (for example 24) is arranged within said through-wafer cavity (for example 20); filling at least a portion of said through-wafer cavity (for example 20) with an attachment metal (for example 32) so as to hold the first component chip (for example 24) in said through-wafer cavity (for example 20) by direct contact of at least a side surface (for example 30) of said first component with said attachment metal (for example 32); detaching the handle wafer (for example 44) from the first component chip top surface (for example 26) and the top wafer surface (for example 14); and forming a first conductor (for example 36) between the first integrated circuit contact pad (for example 18) and said via (for example 38).

Other embodiments of this presentation relate to a method of manufacturing an electronic assembly, the method comprising: providing a first component chip (for example 24) having a first component chip top surface (for example 26), a first component chip bottom surface (for example 28) and first component chip side surfaces (for example 30); said first component chip (for example 24) comprising at least one first component contact pad. (for example 34) on said first component chip bottom surface (for example 28); providing a handle wafer (for example 44) having a first surface (for example 46); attaching said first component chip top surface (for example 26) to said first surface (for example 46) of said handle wafer (for example 44); providing a carrier wafer (for example 12) having a top wafer surface (for example 14) and a bottom wafer surface (for example 16); forming in the carrier wafer an electronic integrated circuit (for example 48) having a first integrated circuit contact pad (for example 18) on the top wafer surface (for example 14); forming in the carrier wafer (for example 12) a through-wafer cavity (for example 20) having walls (for example 22) that join said top wafer surface (for example 14) to said bottom wafer surface (for example 16); attaching said top wafer surface (for example 14) to said first surface (for example 46) of said handle wafer (for example 44) such that said first component chip (for example 24) is arranged within said through-wafer cavity (for example 20); filling at least a portion of said through-wafer cavity (for example 20) with an attachment metal (for example 32) so as to hold the first component chip (for example 24) in said through-wafer cavity (for example 20) by direct contact of at least a side surface (for example 30) of said first component (for example 24) with said attachment metal (for example 24), wherein a first portion of said attachment metal (for example 32) touches the carrier wafer (for example 44) and a second portion of said attachment metal electrically contacts said first component contact pad (for example 34); detaching the handle wafer (for example 44) from the first component chip top surface (for example 26) and the top wafer surface (for example 14); and forming a first conductor (for example 37) between the first integrated circuit contact pad (for example 18) and said first portion of said attachment metal (for example 32).

DETAILED DESCRIPTION

The following description is presented to enable one of ordinary skill in the art to make and use the teachings of this presentation and to incorporate them in the context of particular applications, Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of embodiments of this presentation. However, it will be apparent to one skilled in the art that such embodiments may be practiced without necessarily being limited to these specific details.

All the features disclosed in this presentation, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 USC. Section 112, Paragraph 6. In particular, the use of "step of" or "act of" in the claims herein is not intended to invoke the provisions of 35 U.S.C. 112, Paragraph 6.

An electronic assembly according to embodiments of this presentation integrates high-performance integrated circuits, such as GaN RF MMICs, into carrier wafers having integrated circuits, such as silicon-based integrated circuits, in a manner that is inexpensive and has high manufacturing yields and short manufacturing cycles.

According to embodiments of this presentation, the high performance integrated circuit or component can comprise III-Nitride transistors or integrated circuits and they can be integrated, eventually together with resistors, inductors, capacitors and matching networks, into the carrier wafers.

Figure 1:
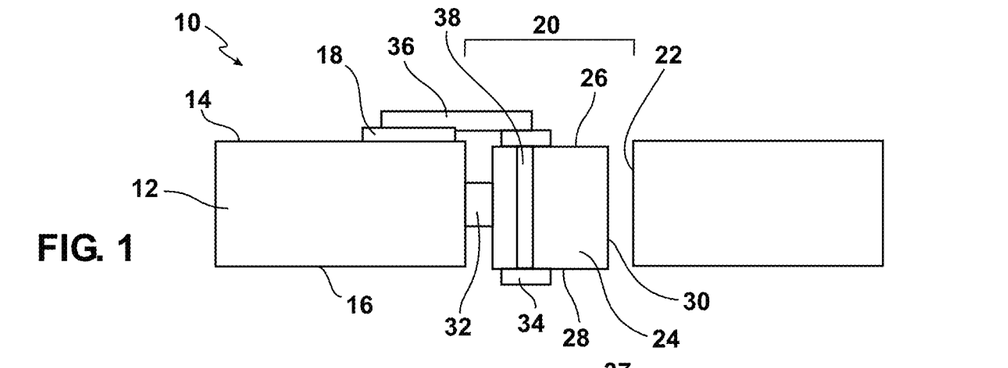
FIG. 1 is a cross-section of an electronic assembly according to an embodiment of this presentation.

FIG. 1 illustrates a cross-section view of an electronic assembly 10 according to embodiments of this presentation, comprising: a carrier wafer 12 having a top wafer surface 14 and a bottom wafer surface 16; an electronic integrated circuit (not shown) being formed in the carrier wafer and comprising at least one first integrated circuit contact pad 18 on the top wafer surface 14. According to an embodiment of this presentation, carrier wafer 12 comprises at least one through-wafer cavity 20 having walls 22 that join top wafer surface 14 to bottom wafer surface 16. According to an embodiment of this presentation, a first component chip 24 having a top surface 26, a bottom surface 28 and side surfaces 30, is held in the through-wafer cavity 20 by an attachment material 32 that attaches at least one wall 22 of the through-wafer cavity 20 to at least one of the bottom surface 28 and a side surface 30. According to an embodiment of this presentation, attachment material 32 is a metal and it holds the first component chip (24) in said through-wafer cavity (20) by being in direct contact with at least a side surface (30) of the first component chip (24). According to embodiments of this presentation, the electronic integrated circuit of carrier wafer 12 can be formed within the top wafer surface 14 using known integrated circuit manufacturing processes, including but not limited to photolithography, epitaxial growth, oxidization of exposed layers, etc.

According to an embodiment of this presentation, the carrier wafer 12 and the first component chip 24 have a same thickness, Optionally, attachment metal 32 can fill cavity 20, thus attaching most of the side surfaces of first component chip 24 to the walls 22 of through-wafer cavity 20. By "same thickness" it is meant that a difference in thickness between the carrier wafer and the component chip is negligible.

According to an embodiment of this presentation, the first component chip 24 comprises at least one first component contact pad 34 on the first component chip bottom surface 28, and a first conductor 36, 38 connects the first integrated circuit contact pad 18 to the first component contact pad 34. According to an embodiment of this presentation, the first conductor 36, 38 comprises a via 38 that traverses the first component chip 24 from its top surface 26 to its bottom surface 28, where via 38 contacts the contact pad 34. According to an embodiment of this presentation, the first conductor 36, 38 further comprises a metal strip or wire 36 that connects the first integrated circuit contact pad 18 to a top portion of via 38 on the first component chip top surface 26, According to an embodiment of this presentation, the metal strip or wire 36 is formed using a top metal fabrication process compatible with the fabrication process of the electronic integrated circuit of carrier wafer 12 (e.g. CMOS). This fabrication process can comprise passivating the top surface of the assembly, mask etching contact openings and forming the metal strip or wire 36 by masking and sputtering.

According to embodiments of this presentation, the first component chip 24 can comprise at least one vertical transistor that has top contact pads (not shown) on top surface 26, for example connected to the gate and source of the transistor, and wherein contact pad 34 is connected to the drain of the transistor.

Figure 2:
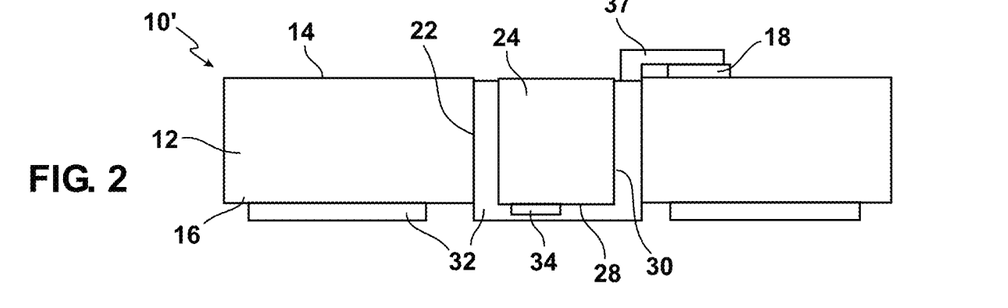
FIG. 2 is a cross-section of an electronic assembly according to an embodiment of this presentation.

FIG. 2 illustrates an electronic arrangement 10' according to an embodiment of this presentation, that is identical to the embodiment in FIG. 1 except that the first component chip 24 does not comprise via 38, Instead, in order to connect the top integrated circuit contact pad 18 to the bottom component chip contact pad 34, the attachment metal 32 fills at least a portion of cavity 20 along all the height of cavity wall 22 such that a top portion of the attachment metal 32 is flush with the top surface 14 of carrier wafer 12. Attachment metal 32 also covers at least a portion of the bottom side 28 of component chip 24, and touches the contact pad 34. In addition, a metal strip or wire 37 connects the contact pad 18 to the top portion of the attachment metal 32 that is flush with the top surface 14 of carrier wafer 12. Metal strip or wire 37 can be formed, in the same way as metal strip or wire 36, using a top metal fabrication process compatible with the fabrication process of the electronic integrated circuit of carrier wafer 12. According to embodiments of this presentation, the top portion of metal 32 being "flush" with the top wafer surface 14 is to be understood as meaning that the two surfaces are in a same plane, or have, with respect to each other, a small or negligible height difference. As illustrated in FIG. 2, according to embodiments of this presentation, the attachment metal 32 can extend along portions of the bottom surface 16 of the carrier wafer 12 as well as portions of the bottom surface 28 of component chip 24. Metal etching can be used to separate portions of the attachment metal 32 on the bottom surfaces of arrangement 10', so as to electrically isolate said portions from each other.

According to an embodiment of this presentation, component chip 24 can also be thinner than carrier wafer 12, as illustrated for example in FIG. 6 hereafter.

FIG. 3 illustrates an electronic arrangement 10" according to an embodiment of this presentation, that is identical to the embodiment in FIG. 1 except that the first component chip 24 is thinner than the carrier wafer 12, According to an embodiment, the contact metal 32 can attach component chip 24 by direct contact with one or more side surfaces 30 and walls 22 of the through wafer cavity 20. According to an embodiment of this presentation, attachment metal 32 holds the first component chip 24 such that the first component chip top surface 26 is flush with the top wafer surface 14. According to embodiments of this presentation, the first component chip top surface 26 being "flush" with the top wafer surface 14 is to be understood as meaning that the two surfaces are in a same plane, or have with respect to each other, a small or negligible height difference, such as resulting from the process of permanently attaching first component chip 24 to the walls 22 of through wafer cavity 20 while both the first component chip top surface 26 and the top wafer surface 14 are attached temporarily to a same handle wafer, for example according to a process as illustrated hereafter. At this juncture, it must be emphasized that, for clarity, the figures are not drawn to scale.

According to embodiments of this presentation and as illustrated in FIG. 3, the conductor that connects the top integrated circuit contact pad 18 to the bottom component chip contact pad 34 comprises as in FIG. 1 a via 38 that traverses the first component chip 24. Attachment metal 32 fills at least a portion of through-wafer cavity so as to directly contact at least a portion of the walls 30 of component chip 24, but it can optionally also contact at least a portion of the bottom surface 28 of component chip 24 (and contact at least a portion of contact pad 34), as illustrated in FIG. 3.

FIG. 4 illustrates an electronic arrangement 10''' according to an embodiment of this presentation, that is identical to the embodiment in FIG. 2 except that, in order to connect the top integrated circuit contact pad 18 to the bottom component chip contact pad 34, carrier wafer 12 comprises a via 40 connecting contact pad 18 to the bottom surface 16 of carrier wafer 12. Further, the attachment metal 32 fills at least a portion of cavity 20 and covers a portion of bottom surface 16 such that it contacts both a bottom portion of via 40 and bottom contact pad 34. Optionally and as illustrated in FIG. 4, the first component chip 24 is thinner than the carrier wafer 12.

FIG. 5 illustrates an electronic arrangement 100 according to an embodiment of this presentation, that is identical to the embodiment in FIG. 1 except that it comprises a second component chip 24' having a top surface 26', a bottom surface 28', side walls 30', a bottom contact pad 34' and a via 38' connecting the contact pad 34' to the top surface 26' held in through-wafer cavity 20. Further, carrier wafer 12 comprises a second top contact pad 18' connected to the electronic integrated circuit (not shown) formed in the carrier wafer, and a conductor 36' similar to conductor 36 connects integrated circuit contact pad 18' to a top portion of via 38' and, through the via, to component contact pad 34'. As component chip 24, component chip 24' is held in through-wafer cavity 20 by direct contact with attachment metal 32. Attachment metal 32 can fill a portion or the totality of the space between the walls 22 of cavity 20 and the walls of the component chip (FIG. 1) or chips (FIG. 5) in the cavity. In the embodiment illustrated in FIGS. 1 and 5, the component chips 24, 24' have the same thickness as carrier wafer 12, but they can optionally be thinner than the carrier wafer 12.

FIG. 6 illustrates an electronic arrangement 100' according to an embodiment of this presentation, that is identical to the embodiment in FIG. 2 except that it comprises a second component chip 26' held in through-wafer cavity 20, having a top surface 26', a bottom surface 28', side walls 30' and a bottom contact pad 34', but no via 38'. As in FIG. 2, the attachment metal 32 fills at least a portion of cavity 20 along all the height of cavity wall 22 such that a top portion of the attachment metal 32 is flush with the top surface 14 of carrier wafer 12. Attachment metal 32 also covers at least a portion of the bottom sides 28 and 28' of component chips 24 and 24', and touches the contact pads 34 and 34'. In addition, a metal strip or wire 37 connects the contact pad 18 to the top portion of the attachment metal 32 that is flush with the top surface 14 of carrier wafer 12, thus contacting top contact pad 18 to bottom pads 34 and 34'.

As illustrated in FIG. 6, the component chips 24, 24' can also comprise top contact pads 102, 102' connected to a top contact pad 104 of carrier wafer 12 using a metal line or wire 106. Such top contact connections can also be present in the embodiments of FIGS. 1-5, as illustrated for example in FIGS. 3 and 4.

According to embodiments of this presentation, the walls 22 of the through-wafer cavity 20 can be covered with a dielectric 42, as illustrated in FIG. 6. According to embodiments of this presentation, the carrier wafer 12 and the component chip 24 are made of different materials. For example, the carrier wafer can be a silicon wafer, with an integrated circuit made using known CMOS technology, and the component chip 24 can comprise a III-V material substrate with one or more III-V HEMT transistors.

Figure 7:
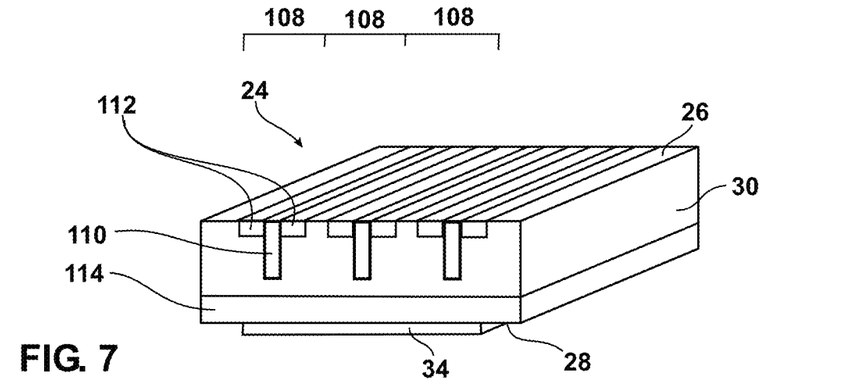
FIG. 7 is an elevation view of a component chip that can be used in an electronic assembly according to an embodiment of this presentation.

FIG. 7 is a schematic elevation view of a component chip 24 according to embodiments of this presentation, comprising three vertical HEMT transistors 108 having each a trench gate electrode 110, top surface source regions 112 on both side of the gate trench, and a bottom surface drain region 114. According to embodiments of this presentation, contact pad 34 is in electrical contact with drain region 114. Contact pads for the gate and source of component chip 24 can be present on top surface 26 but are not illustrated in FIG. 7. Such top contact pads can be such as contact pads 102 or 102' of FIGS. 3, 4 or 6. Component chip 24 can also comprise passive circuit elements (not shown).

Figure 8A:
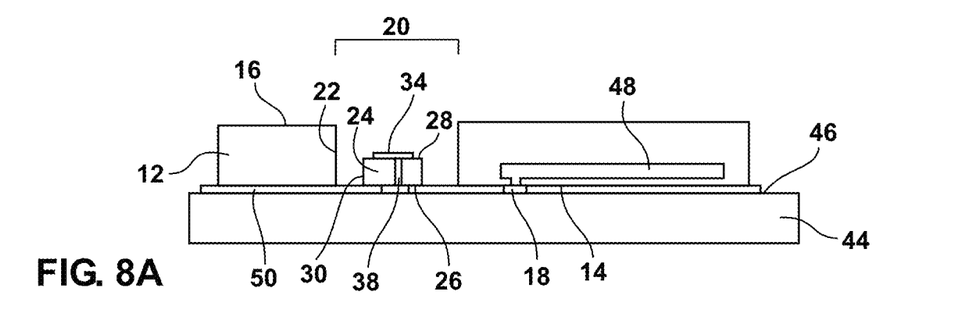
FIGS. 8A to 8C illustrate steps of a method of manufacturing an electronic assembly according to embodiments of this presentation.
Figure 8B:
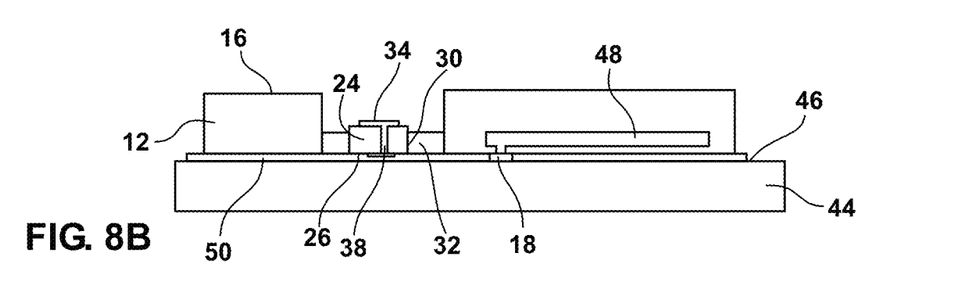
Figure 8C:
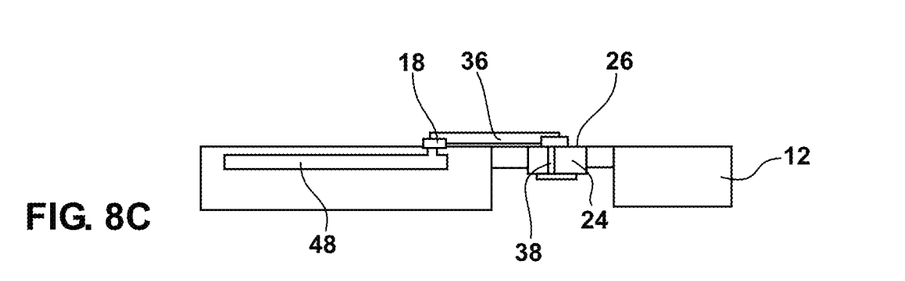

FIGS. 8A to 8C illustrate steps of a method of manufacturing an electronic assembly according to embodiments of this presentation. As illustrated in FIG. 8A, first steps of the method comprise: providing a first component chip 24 having a first component chip top surface 26, a first component chip bottom surface 28 and first component chip side surfaces/walls 30; first component chip 24 comprising at least one first component contact pad 34 on the first component chip bottom surface 28, and also comprising a via 38 providing an electrical path between the first component chip top surface 26 and the first component contact pad 34. The method further comprise providing a handle wafer 44 having a top surface 46; and attaching, for example using a temporary adhesive layer 50, the top surface 26 of component chip 24 (flipped upside down) to the top surface 46 of the handle wafer 44. The method further comprise, still referring to FIG. 8A, providing a carrier wafer 12 having a top wafer surface 14 and a bottom wafer surface 16; forming in the carrier wafer 12 an electronic integrated circuit 48 (for example using known photolithography manufacturing processes) having a first integrated circuit contact pad 18 on the top wafer surface 14; forming in the carrier wafer a through-wafer cavity 20 having walls 22 that join the top wafer surface 14 to the bottom wafer surface 16; and attaching the top wafer surface 14 of carrier wafer 12 (flipped upside down) to the top surface 46 of handle wafer 44 such that first component chip 24 is arranged within the through-wafer cavity 20. According to embodiments of this presentation, wafer 12 can be thinned, for example at this stage, by polishing bottom surface 16.

As illustrated in FIG. 8B, the method further comprises filling at least a portion of the through-wafer cavity 20 with an electrically conductive attachment material 32, preferably metal, so as to hold the first component chip 24 in the through-wafer cavity 20 by direct contact of at least one side surface 30 of the first component 24 with the attachment metal 32. According to embodiments of this presentation, when attachment material 32 is a metal, at least a portion of the space in cavity 20, between the component chip walls 30 and the cavity walls, can be filled using an electrometallurgy process (electroforming or electroplating or electrodeposition). If electroforming is used, a film of metal can be deposited on the walls 22 of the through-cavity 20 and on the exposed surfaces of component chip 24 before said electroforming. According to an embodiment of this presentation, before such film of metal is deposited, a layer of dielectric can be deposited on the walls 22.

According to embodiments of this presentation, attaching component chip 24 to the walls 22 of the through wafer cavity when both the top surfaces 14, 26 of the carrier wafer 12 and the component chip 24 are temporarily attached to surface 46 of handle wafer 44 allows ensuring that the top surfaces 14, 26 of the carrier wafer 12 and the component chip 24 are flush.

As illustrated in FIG. 8C, the method further comprises detaching the handle wafer 44 from the first component chip top surface 26 and the top wafer surface 14; and (after flipping the carrier wafer 12 and attached component chip 24), forming a conductor, such as a metal line or strip 36, between the first integrated circuit contact pad 18 and a top portion of via 38. According to embodiments of this presentation, metal line or strip 36 can be manufactured using top metal manufacturing process steps of the manufacturing process steps used to make integrated circuit 48.

Figure 9A:
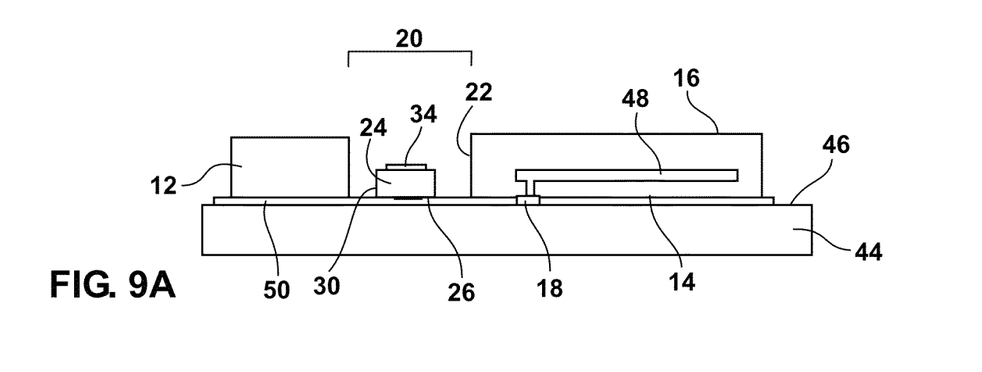
FIGS. 9A to 9C illustrate steps of a method of manufacturing an electronic assembly according to embodiments of this presentation.
Figure 9B:
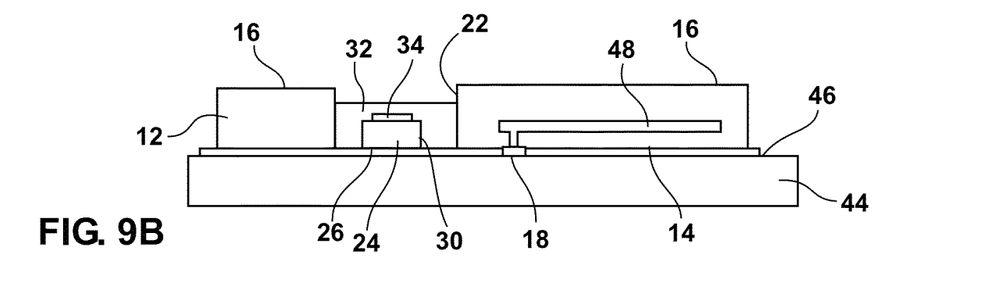
Figure 9C:
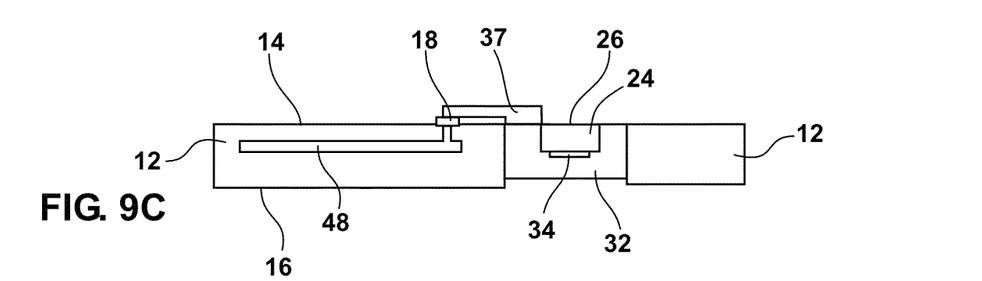

FIGS. 9A to 9C illustrate steps of a method of manufacturing an electronic assembly according to embodiments of this presentation. As illustrated in FIG. 9A, first steps of the method comprise: providing a first component chip 24 having a first component chip top surface 26, a first component chip bottom surface 28 and first component chip side surfaces/walls 30; first component chip 24 comprising at least one first component contact pad 34 on the first component chip bottom surface 28, and also comprising a via 38 providing an electrical path between the first component chip top surface 26 and the first component contact pad 34. The method further comprise providing a handle wafer 44 having a top surface 46; and attaching, for example using a temporary adhesive layer 50, the top surface 26 of component chip 24 (flipped upside down) to the top surface 46 of the handle wafer 44. The method further comprise, still referring to FIG. 9A, providing a carrier wafer 12 having a top wafer surface 14 and a bottom wafer surface 16; forming in the carrier wafer 12 an electronic integrated circuit 48 (for example using known photolithography manufacturing processes) having a first integrated circuit contact pad 18 on the top wafer surface 14; forming in the carrier wafer a through-wafer cavity 20 having walls 22 that join the top wafer surface 14 to the bottom wafer surface 16; and attaching the top wafer surface 14 of carrier wafer 12 (flipped upside down) to the top surface 46 of handle wafer 44 such that first component chip 24 is arranged within the through-wafer cavity 20.

As illustrated in FIG. 9B, the method further comprises filling at least a portion of the through-wafer cavity 20 with an electrically conductive attachment material 32, preferably metal, so as to hold the first component chip 24 in the through-wafer cavity 20 by direct contact of at least one side surface 30 of the first component 24 with the attachment metal 32, and also as to contact bonding pad 34 with conductive attachment material 32. According to embodiments of this presentation, when attachment material 32 is a metal, at least a portion of the space in cavity 20, between the component chip walls 30 and the cavity walls, can be filled using an electrometallurgy process. According to embodiments of this presentation, attaching component chip 24 to the walls 22 of the through wafer cavity 20 when both the top surfaces 14, 26 of the carrier wafer 12 and the component chip 24 are temporarily attached to surface 46 of handle wafer 44 allows ensuring that the top surfaces 14, 26 of the carrier wafer 12 and the component chip 24 are flush. As illustrated in FIG. 9B, conducting material 32 preferably fills cavity 20 such that a surface of conductive material 32 is flush with top surface 14 of carrier wafer 12. According to embodiments of this presentation, wafer 12 can be thinned, for example at this stage, by polishing bottom surface 16.

As illustrated in FIG. 9C, the method further comprises detaching the handle wafer 44 from the first component chip top surface 26 and the top wafer surface 14; and (after flipping the carrier water 12 and attached component chip 24), forming a conductor, such as a metal line or strip 37, between the first integrated circuit contact pad 18 and the surface of conductive material 32 that is flush with top surface 14 of carrier wafer 12. According to embodiments of this presentation, metal line or strip 37 can be manufactured using top metal manufacturing process steps of the manufacturing process steps used to make integrated circuit 48.

Component chips 24, 24' are preferably pre-tested to verify their functionality before assembly. As a result, the yield of a final devices comprising a plurality of component chips 24, 24' is improved compared to a component manufacturing the circuits in components chips 24, 24'; on a same wafer.

The inventors have noted that the embedding of a component chip 24 (comprising a single chip or a plurality of component chips 24, 24', etc., as outlined above) in a metal-filled cavity allows to significantly drain any chip-produced heat, which in return limits significantly any size change due to a temperature change, and allows any mechanical strain due to such size change to remain moderate, even though metal is not resilient. It is noted that material 32 can also be non-metallic, in which case it can be chosen to be a material with greater pliability, although at the expense of having a reduced thermal conductivity.

According to embodiments of this presentation, component chip 24 can comprise a GaN, InP or GaAs component and it can be fabricated on a substrate such as Si, SiGe, InP, GaAs, Alumina, or diamond.

According to an embodiment of this presentation, the integrated circuit 48 of carrier wafer 12 can comprise metal routing and passive components fabricated at the wafer scale.

According to an embodiment of this presentation, conductors 36, 37 can be made out of thin films, thick, plated interconnects, multi-layers, etc. The interconnections can for example be made using the back-end steps of a CMOS manufacturing process.

According to embodiments of this presentation, any of the component chip 24 and the carrier wafer 12 can comprise integrated circuitry, including active and/or passive circuitry, on both their top and bottom surfaces, thus allowing the manufacture of compact assemblies.

Having now described the invention in accordance with the requirements of the patent statutes, those skilled in this art will understand how to make changes and modifications to the present invention to meet their specific requirements or conditions. Such changes aid modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom.

Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step (s) of . . . "

All elements, parts and steps described herein are preferably included. It is to be understood that any of these elements, parts and steps may be replaced by other elements, parts and steps or deleted altogether as will be obvious to those skilled in the art.

What is claimed:

1. An electronic assembly, comprising:
    a carrier wafer having a top wafer surface and a bottom wafer surface; an electronic integrated circuit being formed in the carrier wafer and comprising a first integrated circuit contact pad on the top wafer surface; said carrier wafer comprising a through-wafer cavity having walls that join said top wafer surface to said bottom wafer surface;
    a first component chip having a first component chip top surface, a first component chip bottom surface and first component chip side surfaces, the first component chip being held in said through-wafer cavity by direct contact of at least a side surface of said first component chip with an attachment metal that fills at least a portion of said through-wafer cavity;
    said first component chip comprising at least one first component contact pad on said first component chip bottom surface; and
    a first conductor connecting said first integrated circuit contact pad and said first component contact pad.

2. The electronic assembly of claim 1, wherein said carrier wafer and said first component chip have a same thickness, and wherein said first conductor comprises a via traversing said first component chip.

3. The electronic assembly of claim 2, wherein said first conductor comprises a metal strip or wire connecting said first integrated circuit contact pad to a top portion of said via traversing said first component chip.

4. The electronic assembly of claim 1, wherein said carrier wafer and said first component chip have a same thickness, wherein said attachment metal fills said at least a portion of said through-wafer cavity along the full height of said through-wafer cavity; and wherein said first conductor comprises said attachment metal.

5. The electronic assembly of claim 4, wherein said first conductor comprises a metal strip or wire connecting said first integrated circuit contact pad to a top portion of said attachment metal.

6. The electronic assembly of claim 5, wherein said attachment metal covers at least a portion of said first component chip bottom surface and said first component contact pad.

7. The electronic assembly of claim 1, wherein said carrier wafer is thicker than said first component chip, wherein the attachment metal holds the first component chip such that the first component chip top surface is flush with the top wafer surface, and wherein said first conductor comprises said attachment metal.

8. The electronic assembly of claim 7, wherein said attachment metal fills said at least a portion of said through-wafer cavity along the full height of said through-wafer cavity; wherein said first conductor comprises a metal strip or wire connecting said first integrated circuit contact pad to a top portion of said attachment metal.

9. The electronic assembly of claim 8, wherein said attachment metal covers at least a portion of said first component chip bottom surface and said first component contact pad.

10. The electronic assembly of claim 7, wherein said first conductor comprises said attachment metal as well as a via traversing said first carrier wafer.

11. The electronic assembly of claim 10, wherein said attachment metal covers at least a portion of said first component chip bottom surface, a bottom portion of said via traversing said first carrier wafer.

12. The electronic assembly of claim 1, wherein said carrier wafer is thicker than said first component chip, wherein the attachment metal holds the first component chip such that the first component chip top surface is flush with the top wafer surface, and wherein said first conductor comprises a via traversing said first component chip.

13. The electronic assembly of claim 12, wherein said first conductor comprises a metal strip or wire connecting said first integrated circuit contact pad to a top portion of said via traversing said first component chip.

14. The electronic assembly of claim 1, wherein the walls of the through-wafer cavity are covered with a dielectric layer.

15. The electronic assembly of claim 1, wherein the carrier wafer and the first component chip are made of different materials.

16. The electronic assembly of claim 1, wherein the first component chip is an integrated circuit chip comprising one or more transistors.

17. The electronic assembly of claim 1, comprising a second component chip also held in said through-cavity by direct contact of at least a side surface of said second component chip with said attachment metal; said second component chip comprising at least one second component contact pad on one of a top surface and a bottom surface of the second component chip;
    the electronic integrated circuit formed in the carrier wafer comprising a second integrated circuit contact pad on one of the top wafer surface and the bottom wafer surface; wherein
    a second conductor connects the second integrated circuit contact pad and the second component contact pad.

18. The electronic assembly of claim 17, wherein at least one of the first component chip and the second component chip is thinner than the wafer, and wherein:

the attachment metal holds the first and second component chips such that the first and second component chip top surfaces are flush with the top wafer surface.

19. A method of manufacturing an electronic assembly, comprising:
- providing a first component chip having a first component chip top surface, a first component chip bottom surface and first component chip side surfaces; said first component chip comprising at least one first component contact pad on said first component chip bottom surface and a via providing an electrical path between the first component chip top surface and the first component contact pad;
- providing a handle wafer having a first surface;
- attaching said first component chip top surface to said first surface of said handle wafer;
- providing a carrier wafer having a top wafer surface and a bottom wafer surface;
- forming in the carrier wafer an electronic integrated circuit having a first integrated circuit contact pad on the top wafer surface;
- forming in the carrier wafer a through-wafer cavity having walls that join said top wafer surface to said bottom wafer surface;
- attaching said top wafer surface to said first surface of said handle wafer such that said first component chip is arranged within said through-wafer cavity;
- filling at least a portion of said through-wafer cavity with an attachment metal so as to hold the first component chip in said through-wafer cavity by direct contact of at least a side surface of said first component with said attachment metal;
- detaching the handle wafer from the first component chip top surface and the top wafer surface; and
- forming a first conductor between the first integrated circuit contact pad and said via.

20. A method of manufacturing an electronic assembly, comprising:
- providing a first component chip having a first component chip top surface, a first component chip bottom surface and first component chip side surfaces; said first component chip comprising at least one first component contact pad on said first component chip bottom surface;
- providing a handle wafer having a first surface;
- attaching said first component chip top surface to said first surface of said handle wafer;
- providing a carrier wafer having a top wafer surface and a bottom wafer surface;
- forming in the carrier water an electronic integrated circuit having a first integrated circuit contact pad on the top wafer surface;
- forming in the carrier wafer a through-wafer cavity having walls that join said top wafer surface to said bottom wafer surface;
- attaching said top wafer surface to said first surface of said handle wafer such that said first component chip is arranged within said through-wafer cavity;
- filling at least a portion of said through-wafer cavity with an attachment metal so as to hold the first component chip in said through-wafer cavity by direct contact of at least a side surface of said first component with said attachment metal, wherein a first portion of said attachment metal touches the carrier wafer and a second portion of said attachment metal electrically contacts said first component contact pad;
- detaching the handle wafer from the first component chip top surface and the top wafer surface; and
- forming a first conductor between the first integrated circuit contact pad and said first portion of said attachment metal.

* * * * *